United States Patent
Yaacob et al.

(10) Patent No.: US 9,998,748 B2
(45) Date of Patent: Jun. 12, 2018

(54) METHODS AND SYSTEMS OF ARCHIVING MEDIA FILES

(71) Applicant: Disney Enterprises, Inc., Burbank, CA (US)

(72) Inventors: Yazmaliza Yaacob, Burbank, CA (US); Nimesh Narayan, Burbank, CA (US)

(73) Assignee: Disney Enterprises, Inc., Burbank, CA (US)

( * ) Notice: Subject to any disclaimer, the term of this patent is extended or adjusted under 35 U.S.C. 154(b) by 442 days.

(21) Appl. No.: 14/254,791

(22) Filed: Apr. 16, 2014

(65) Prior Publication Data

US 2015/0302039 A1    Oct. 22, 2015

(51) Int. Cl.
| | | |
|---|---|---|
| *G06F 17/30* | (2006.01) | |
| *H04N 19/50* | (2014.01) | |
| *H04N 19/184* | (2014.01) | |
| *G06F 17/22* | (2006.01) | |
| *H03M 7/30* | (2006.01) | |

(52) U.S. Cl.
CPC .......... *H04N 19/50* (2014.11); *G06F 17/3023* (2013.01); *H04N 19/184* (2014.11); *G06F 17/2288* (2013.01); *G06F 17/30162* (2013.01); *G06F 17/30309* (2013.01); *H03M 7/3091* (2013.01)

(58) Field of Classification Search
CPC .......... G06F 17/30964; G06F 17/3023; G06F 17/30162; G06F 17/30309; G06F 17/2288
USPC .................. 707/625, 638, 695, 914; 715/229
See application file for complete search history.

(56) References Cited

U.S. PATENT DOCUMENTS

| | | | | |
|---|---|---|---|---|
| 6,816,872 B1* | 11/2004 | Squibb | .............. | G06F 17/30067 707/707 |
| 6,904,430 B1* | 6/2005 | Livshits | .............. | G06F 17/2211 707/707 |
| 7,844,580 B2* | 11/2010 | Srivastava | ........ | G06F 17/30215 707/690 |
| 2011/0137854 A1* | 6/2011 | Walter | ................ | G06F 17/3007 707/608 |
| 2015/0149493 A1* | 5/2015 | Schoning | .......... | G06F 17/30386 707/758 |

* cited by examiner

*Primary Examiner* — Robert Beausoliel, Jr.
*Assistant Examiner* — Alexandria Bromell
(74) *Attorney, Agent, or Firm* — Sheppard Mullin Richter & Hampton

(57) ABSTRACT

Methods and systems of archiving media files are provided. Media files may be archived such that only the difference between a media file and a base media file is stored. The base media file is archived. The media file to be archived and the base media file may have common attributes such as video codec, resolution, frame rate, and/or color space. A media file to be archived may be compared to the base media file to determine any difference. Bit-to-bit analysis or frame-to-frame analysis may be performed to identify the differences between a media file to be archived and a base media file. The differences may be extracted from the media file to be archived. A difference media file may be created to store the difference of a media file with respect to the base media file. A record may be created to store the actual location where the difference is extracted from a media file to be archived.

17 Claims, 6 Drawing Sheets

METHODS AND SYSTEMS OF ARCHIVING MEDIA FILES

TECHNICAL FIELD

The present application relates generally to digital media files, more particularly, some embodiments relate to methods and systems of archiving media files.

DESCRIPTION OF THE RELATED ART

The widespread use of computers, digital media devices, e.g., video, audio, image, picture, and/or gaming media devices, and the Internet has resulted in the generation and use of digital media files. Digital media files may contain binary data that provide various forms of media content (e.g., video, audio, image, or interactive content). Media files are typically stored on a computer storage medium that is accessible by computer devices, such as CD-ROMs, hard drives, memory sticks, etc. Massive file storage is needed to store these digital media files.

BRIEF SUMMARY OF THE APPLICATION

Methods and systems of archiving media files, such as a movie studio archiving movies, are provided. Media files may be compressed, encoded, and/or encrypted. Various embodiments described herein archive media files such that only the difference between a media file and a base media file is stored. A base media file is archived. The media file to be archived and the base media file may have common attributes such as video codec, resolution, frame rate, and/or color space. A media file to be archived may be compared to the base media file to determine any difference.

In some embodiments, bit-to-bit analysis may be performed to determine the difference that a media file has in comparison to the base media file. Every bit of the media file to be archived may be compared to a bit of the base media file. Some embodiments may perform bit-to-bit analysis to compare a segment of a media file to be archived to a segment of a base media file. The total number of different bits in a segment may be compared to a bit size threshold to determine whether the segments are different. When the segments are different, the bits that are different may be extracted from the media file to be archived. A difference media file may be created and archived to store the different bits. In various embodiments, a record such as a log file or a look-up table may be created to indicate the actual location where the different bits are extracted from the media file to be archived. The record may further store relative locations in the base media file. In other words, the locations in the base media file that correspond to the actual locations may be recorded.

In some embodiments, frame-to-frame analysis may be performed to determine the difference that a media file has in comparison to the base media file. Every frame of the media file to be archived may be compared to a frame of the base media file. The frames that do not appear in the base media file or are modified from the base media file may be identified and extracted from the media file to be archived. The actual locations where the frames are extracted from the media file to be archived are recorded. In addition, the frames in the base media file that do not appear in the media file to be archived may be identified and their respective locations may be recorded. In various embodiments, a difference media file such as video insert reel may be created to store the extracted frames. A record such as a composition playlist text document may be created to indicate the actual location (e.g., the time code, or the frame count) of the extracted frames and/or the relative locations in the base media file.

Other features and aspects of the application will become apparent from the following detailed description, taken in conjunction with the accompanying drawings, which illustrate, by way of example, the features in accordance with embodiments of the application. The summary is not intended to limit the scope of the application, which is defined solely by the claims attached hereto.

BRIEF DESCRIPTION OF THE DRAWINGS

The present application, in accordance with one or more various embodiments, is described in detail with reference to the following figures. The drawings are provided for purposes of illustration only and merely depict typical or example embodiments of the application. These drawings are provided to facilitate the reader's understanding of the application and shall not be considered limiting of the breadth, scope, or applicability of the application. It should be noted that for clarity and ease of illustration these drawings are not necessarily made to scale.

The figures are not intended to be exhaustive or to limit the application to the precise form disclosed. It should be understood that the application can be practiced with modification and alteration, and that the application be limited only by the claims and the equivalents thereof.

DETAILED DESCRIPTION OF THE EMBODIMENTS OF THE APPLICATION

To meet various market needs, multiple versions of digital media may be created and distributed. For example, subject to territorial restrictions and regulations as well as language differences, a movie may be created and released in different versions having different features. A version that is released in a specific country or region may include "localized" scene elements ranging from localized title sequences to localized credit rolls. In some cases, entire scenes or characters may be replaced with a localized version to make the film more appealing in certain territories. The picture may be edited (e.g., a scene is replaced, removed, or added) in order to meet a specific censorship or timing requirements of any distribution channel. The availability of localized digital products in the marketplace, especially on videos, impose massive file storage requirements on digital files for localized video or video with alternate cuts made for international territories or other languages.

Conventionally, "Video Masters" for hundreds of different versions of the same title are created and stored. These digital files may be saved separately as a whole end-to-end feature in the same archive. Digital storage and archive of these "video masters" may require maintenance of multiple versions of the same movie, which may be costly of time and resources. This multiplication of full feature length video may create massive storage requirements for archiving when localization and alternate cuts are made for other territories. For example, in a Digital Cinema Package (DCP) Archive, there can be upward of 32 versions of the same feature with slight differentiation on the localized video and/or alternate cut saved on the archive server. If each full feature DCP file size is 150 GB/package, then for 32 full feature files, a storage size of 4.8 TB is required. Further, it is challenging to keep all of these localized versions of a movie in synchrony with each other.

Before describing the application in detail, it is useful to describe an example environment in which the application can be implemented. One such example is illustrated in FIG. 1.

Figure 1:
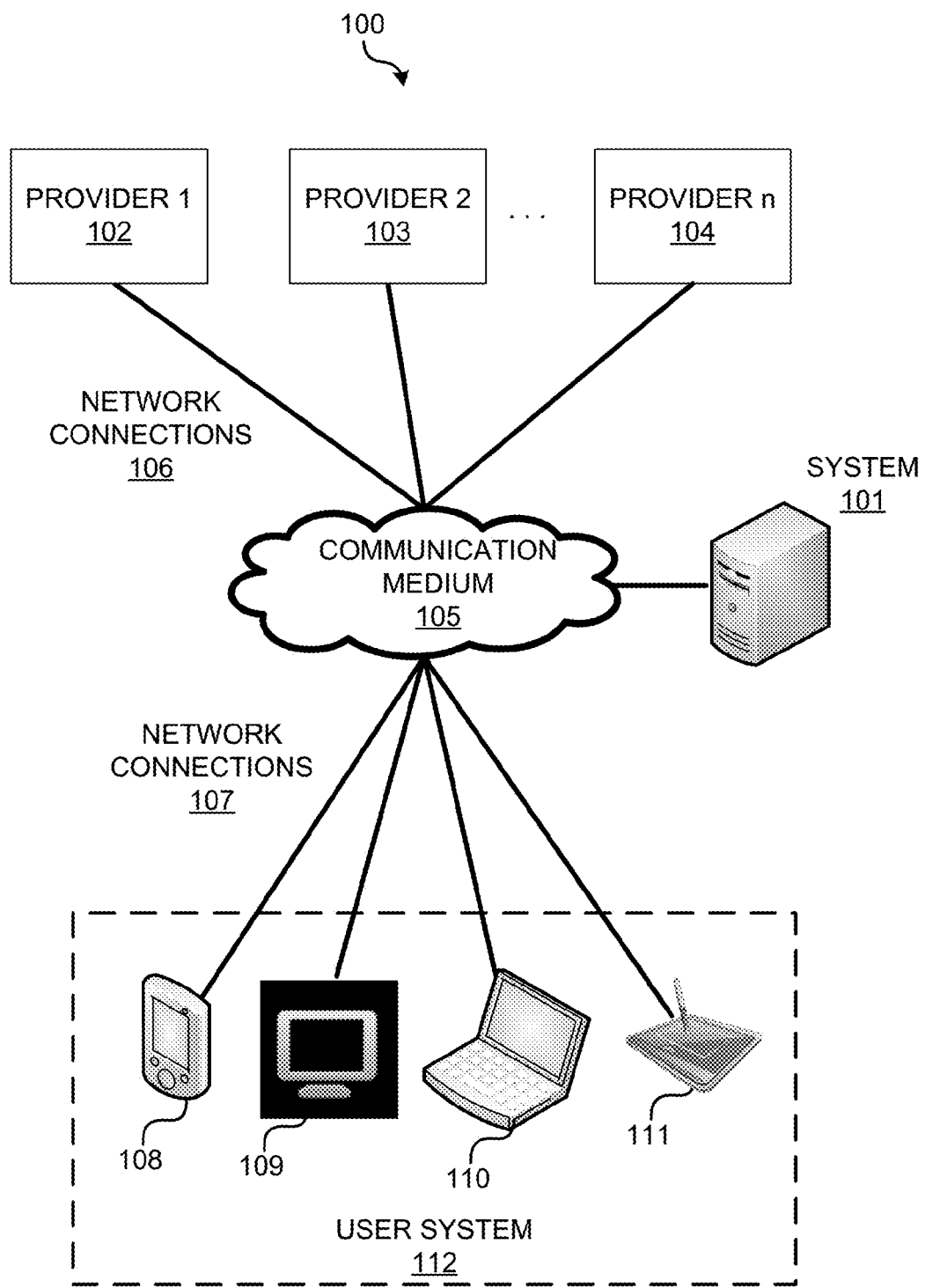
FIG. 1 illustrates an exemplary environment where various embodiments may be implemented.

FIG. 1 illustrates an exemplary environment 100 where various embodiments may be implemented. The environment 100 comprises various user devices 108-111, which may be collectively referred to as a user system 112 connected via a communication medium 105. A digital media file may include one or more media content (e.g., video, audio, text, etc.) When there is multiple media content, these multiple media content may be multiplexed. The media content may be compressed, encoded by various codecs, and/or encrypted. In some embodiments, the communication medium may be a wired system, such as a coaxial cable system, a fiber optic cable system, an Ethernet cable system, or other similar communication medium. Alternatively, the communication medium may be a wireless network system, such as a wireless personal area network, a wireless local area network, a cellular network, or other similar communication medium.

As shown, a user system 112 may include a smartphone 108 (e.g., iPhone®), a TV 109, a computer 110 (e.g., a personal computer), and/or a tablet 111 (e.g., iPad®), through their respective network connections 107, can either interact directly or indirectly with the various digital content providers 1-n 102-104, via their respective network connections 106. For example, a network connection 106 or 107 may include wired connections (e.g., Digital Subscriber Line (DSL), optical) and/or wireless connections (e.g., Wi-Fi.) In various embodiments, a network connection 106 or 107 may include an ad hoc network, an intranet, an extranet, a virtual private network (VPN), a local area network (LAN), a wireless LAN (WLAN), a wide area network (WAN), a portion of the Internet, a portion of the Public Switched Telephone Network (PSTN), a cellular telephone network, or any combination thereof. A network connection 106 or 107 needs not necessarily be the same throughout the environment 100. Various user devices 108-111 described herein may be implemented using the example computer system illustrated in FIG. 6.

In one embodiment, a media file archive platform may be hosted by a media file archive system 101 which is coupled to the communication medium 105. The media file archive system 101 may manage archiving and/or playback of various media files among various providers 1-n 102-104 and among various devices 108-111 of the user system 112. For example, the media file archive system 101 may archive different media files. The media files may belong to a family, where each media file provides a different version of a digital media (e.g., a movie, a game, etc.). Media files of the same family may be based on one base media file, from which derivative media files are created. The media file archive system 101 archives media files such that some of the media files are not archived entirely. In various embodiments, the base media file and the difference between a media file and the base media file are stored. Accordingly, storage size is reduced significantly, and the integrity of different media files is realized. The media file archive system 101 may facilitate the playback of various media files.

In various embodiments, the user system 110 may display an interface related to archive and/or play back of various media files. For example, the user system 112 may be configured to upload one or more media files, to retrieve one or more media files including a base media file, to provide information of archived media files (e.g., by a record such as a log file, or a look-up table), to receive a media file archive request from a user, and/or to receive a media file play request from a user. In one embodiment, a user may download a client component of a media file archive system 101 such as a media file archive application. The client component may be executed locally at a user system 112. In some embodiments, the media file archive system 101 may provide back-end support for the client component.

The media content archive system 101 may be responsible for receiving one or more media files, identifying the base media file of one family, analyzing various media files, identifying the difference between a media file to be archived and a base media file, storing the base media file, creating and storing a media file consisting of the difference between the media file to be archived and a base media file, providing information on how various media files are archived, and/or facilitating playback of a media file on one or more user devices of the user system 112.

Figure 2:
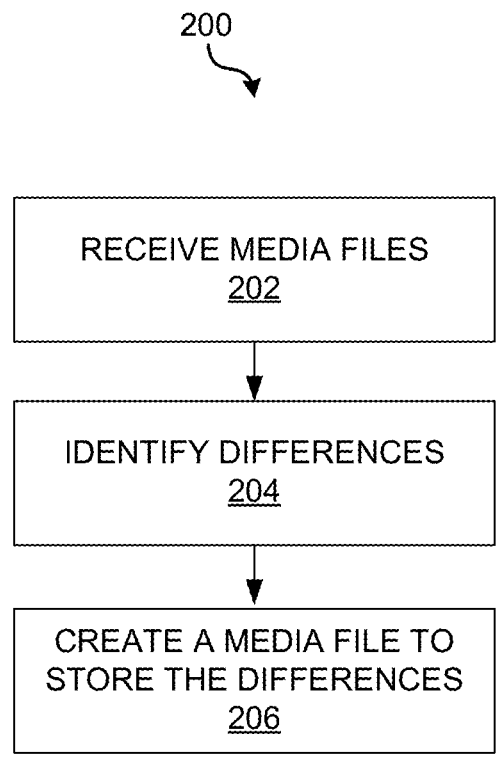
FIG. 2 is a flow diagram illustrating an exemplary method 200 of archiving media files, such as for the media file archive system in FIG. 1.

FIG. 2 is a flow diagram illustrating an exemplary method 200 of archiving media files, such as for the media file archive system 101 in FIG. 1. At step 202, a set of media files is received for archiving. In some embodiments, when multiple media files are received, for each media file, a base media file may be selected from the multiple media files received. In one embodiment, for each media file, the family to which the media file belongs is identified, and the base media file may be selected based on the family. For example, for a movie, the movie title determines the movie family, and the base movie file may be selected according to the movie title. In some embodiments, for each media file received, a base media file may be identified. For example, a benchmark file may be selected as the base media file, from which derivative media files are produced. For example, an original domestic version may be the base media file, and a localized or edited file may be a derivative file. In various embodiments, each media file received may be compressed, encoded, and/or encrypted.

At step 204, a set of differences between a media file to be archived and a base media file are identified. The media file to be archived may be compared to the base media file to determine the set of differences. Each difference is an occurrence of difference between the media file and the base media file. That is, each difference is a segment of a media file that has no matching segment in the base media file. Each occurrence of difference may be associated with the variance between different versions of a digital media. In other words, a change in a scene, subtitle, sound (e.g., a dialogue, melody, language, etc.) and/or other substance between two versions of a movie may be identified. In some embodiments, the media file may be compared to the base media file bit-to-bit. In some embodiments, the media file may be compared to the base media file frame-to-frame. In further embodiments, the differences with respect to the base media file may be extracted from the media file. The segments of a media file, which have matching segments in the base media file, may be removed from the media file. The segments of a media file, which have no matching segments in the base media file, may be retained.

At step 206, a difference media file may be created to store the set of differences identified at step 204. Segments of the media file to be archived that have no matching segments in the base media file are stored. A record configured to produce the media file to be archived, based on the base media file and the media file created at step 206, may be created. The record may comprise an actual location in the second media file where a difference occurs. For example, a location in the media file where a bit appears, or a time point in the media file where a frame appears, may be recorded. The record may also comprise a relative location in the base media file corresponding to the actual location for a difference in the media file to be archived. In some embodiments, the base media file is stored.

Figure 3:
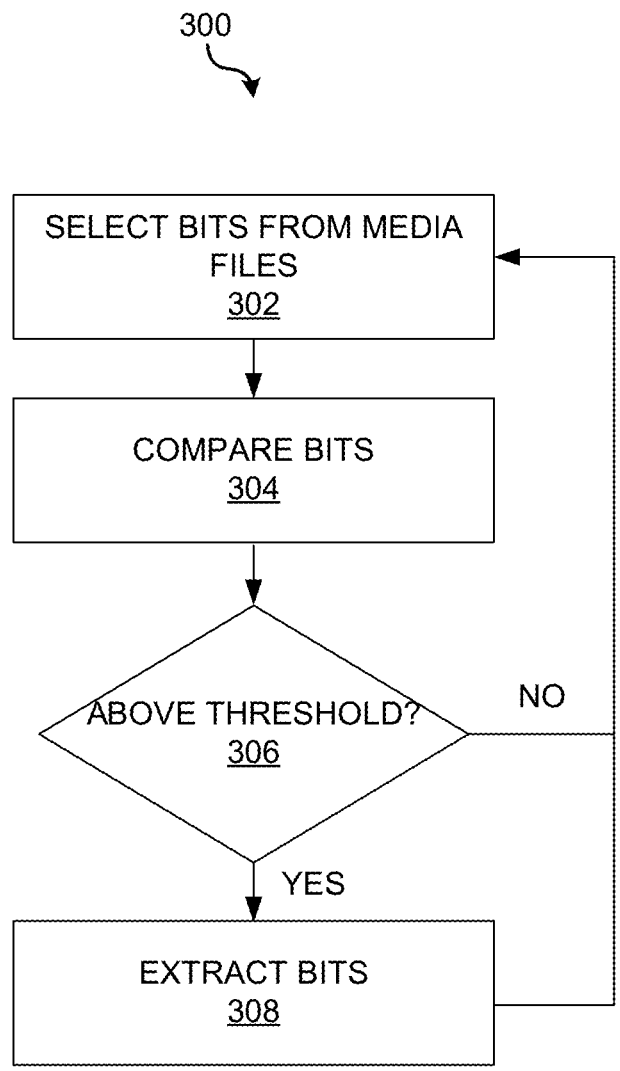
FIG. 3 illustrates a flow diagram of an exemplary method 300 of conducting a bit-to-bit comparison, such as for the step 204 illustrated in FIG. 2.

FIG. 3 illustrates a flow diagram of an exemplary method 300 of conducting a bit-to-bit comparison, such as for the step 204 illustrated in FIG. 2. In some embodiments, every bit of a media file to be archived is compared to a bit of a base media file. All the bits that are different from the base media file are recorded. In some embodiments, media files may be compared in segments. That is, the bit-to-bit comparison is performed between segments of media files. At step 302, multiple bits are selected from a segment of a media file to be archived. In the base media file, bits are also selected from a segment that corresponds to the segment in the media file. A segment of a media file may be defined by a user. In various embodiments, the length of the segment, that is, the number of bits included in a segment, may be defined by a user. At step 304, the bit-to-bit comparison is performed between segments of the media file to be archived and the base media file. When a bit of a media file is determined to be different from a corresponding bit in the base media file, the bit may be marked. For example, the location of the bit may be noted. In various embodiments, the total number of different bits between segments of a media file to be archived and a base media file is counted.

At step 306, the total number of different bits is compared to a bit size threshold. The bit size threshold is a predetermined value that may be defined by a user. If the total number of different bits does not exceed the bit size threshold, the segment of the media file to be archived is considered to match the corresponding segment of a base media file. Bits from the next segment are selected for analysis. However, at step 306, if the total number of different bits exceeds the bit size threshold, the segment of the media file to be archived is considered to be different from the corresponding segment of the base media file. Subsequently, the bits that are identified to be different at step 304 are extracted from the media file to be archived. A difference media file may be created to store the extracted bits from the media file to be archived.

In some embodiments, a record (e.g., a log file or a look-up table) may be created to store the location where the bits are extracted from the media file. In one embodiment, when consecutive bits are extracted from the media file, the record may store the starting location and the end location from the media file. The record may further store the relative locations in the base media file that correspond to the locations in the media file where bits are extracted. The record may store metadata related to an extracted bit, such as time code. The record may be in any form including XML or JSON.

Figure 4:
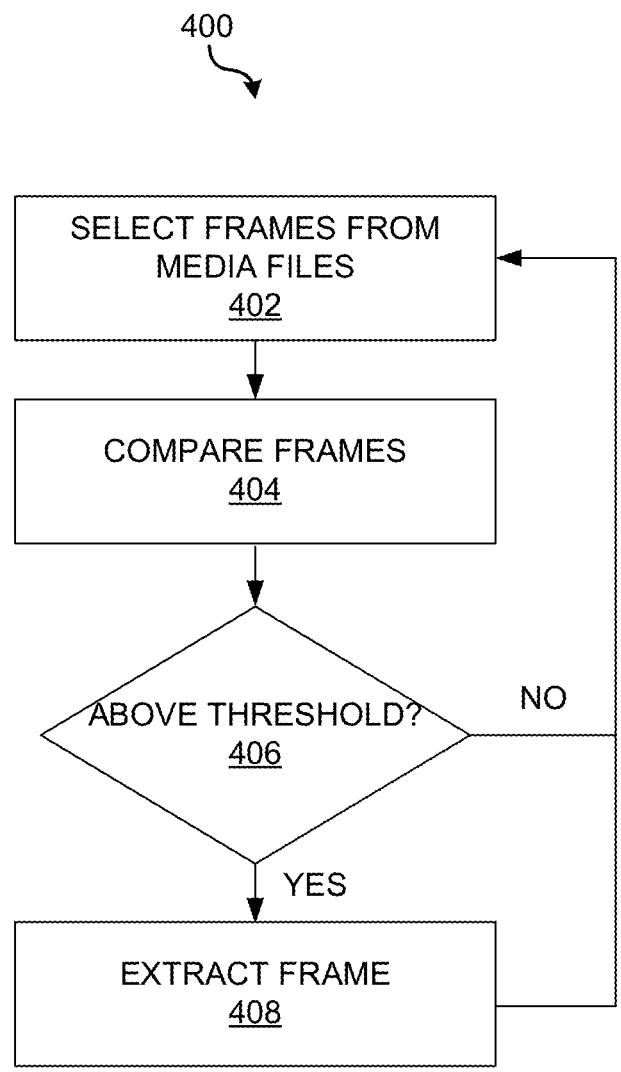
FIG. 4 illustrates a flow diagram of an exemplary method 400 of conducting a frame-to-frame comparison, such as for the step 204 illustrated in FIG. 2.

FIG. 4 illustrates a flow diagram of an exemplary method 400 of conducting a frame-to-frame comparison, such as for the step 204 illustrated in FIG. 2. At step 402, a frame is selected from a media file to be archived. A corresponding frame may be selected from the base media file. The media file to be archived and the base media file may have a set of attributes in common such as video codec, resolution, frame rate, and/or color space. In one embodiment, the corresponding frame may be selected according to the time code, or to the frame count of the frame. In some embodiments, a frame of a media file to be archived may be compared to multiple frames of a media file to determine whether the base media file has a frame that matches the frame. At step 404, the selected frames are compared and analyzed to determine the difference. The difference between the frames may be compared to a frame difference threshold at step 406.

The frame difference threshold may be a predetermined value that is defined by a user. The frame difference may indicate whether a frame of a media file to be archived has a matching frame in the base media file. If the difference determined at step 404 exceeds the frame difference threshold, then the frame of the media file to be archived has no matching frame in the base media file. If the difference does not exceed the frame difference threshold, the frame of the media file to be archived has a matching frame in the base media file. In some embodiments, when a frame only appears in the media file to be archived but does not appear in the base media file, the difference is the entire frame. When a frame of a media file to be archived is modified based on a frame in a base media file, the difference is the modification of the frame in the base media file. When the difference exceeds the frame difference threshold, that is, when the frame of the media file to be archived has no matching frame in the base media file, at step 408, this frame is extracted from the media file to be archived. The location of the frame (e.g., the time code, or the frame count, etc.) may be noted.

In some embodiments, the extracted frame may be provided to a user. The user may instruct whether the frame should be extracted. In various embodiments, all frames of a media file to be archived are analyzed. All frames of a base media file may be analyzed with respect to the media file to be archived. When a frame of a base media file does not appear in a media file to be archived, this frame may be marked and the location of the frame may be recorded.

A difference media file may be created to store the extracted frames from the media file to be archived. In one embodiment, the media file is a video insert reel. In some embodiments, a record (e.g., a log file, a look-up table, or a composition playlist text document) may be created to store the location where the frames are extracted from the media file. The record may further store the locations in the base media file that correspond to the locations in the media file where frames are extracted, or the location of those frames only present in the base media file. The record may store metadata related to an extracted frame, such as time code, or the frame count. The record may be in any form including XML or JSON.

Figure 5:
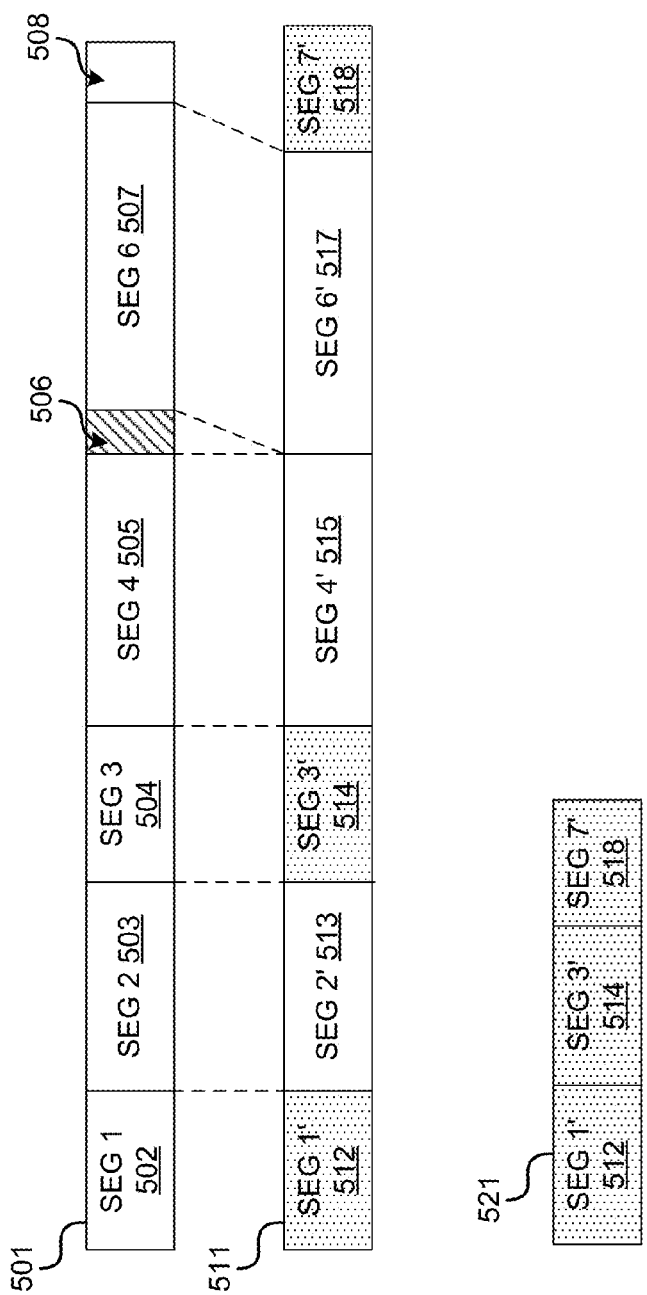
FIG. 5 illustrates an example of archiving media files.

FIG. 5 illustrates an example of archiving media files. FIG. 5 shows a base media file 501 and a derivative media file 511, which is based on the base media file 501. The media files 501 and 521 are archived. The base media file 501 includes segments 502-508. The derivative media file 511 includes segments 512-518. Segments 513, 515, and 517 of the derivative media file 511 are determined to match segments 503, 505, and 507, of the base media file 501, respectively. Segments 512, 514, and 518 of the derivative media file 511 are determined to have no matching segment in the base media file 501. In addition, the segment 506 of the base media file 501 does not appear in the derivative media file 511. In some embodiments, segments 512, 514, and 518 are extracted from the media file 511. In other embodiments, segments 513, 515, and 517 are removed from the derivative media file 511.

As illustrated, the archived media file 521 only includes those segments of the derivative media file 511 that have no matching segments in the base media file 501. Accordingly, the derivative media file 511 is not stored entirely, and only portions of the derivative media file 511 is archived. In various embodiments, a record may be created to log the locations for segments 512, 514, and 518, in the derivative media file 511. The record may further log the locations of segments 502, 504, and 508, in the base media file 501, which correspond to segments 512, 514, and 518. The record may further log the location of the segment 506 in the base media file 501 and provide information that the segment 506 is not present in the derivative media file 511.

Figure 6:
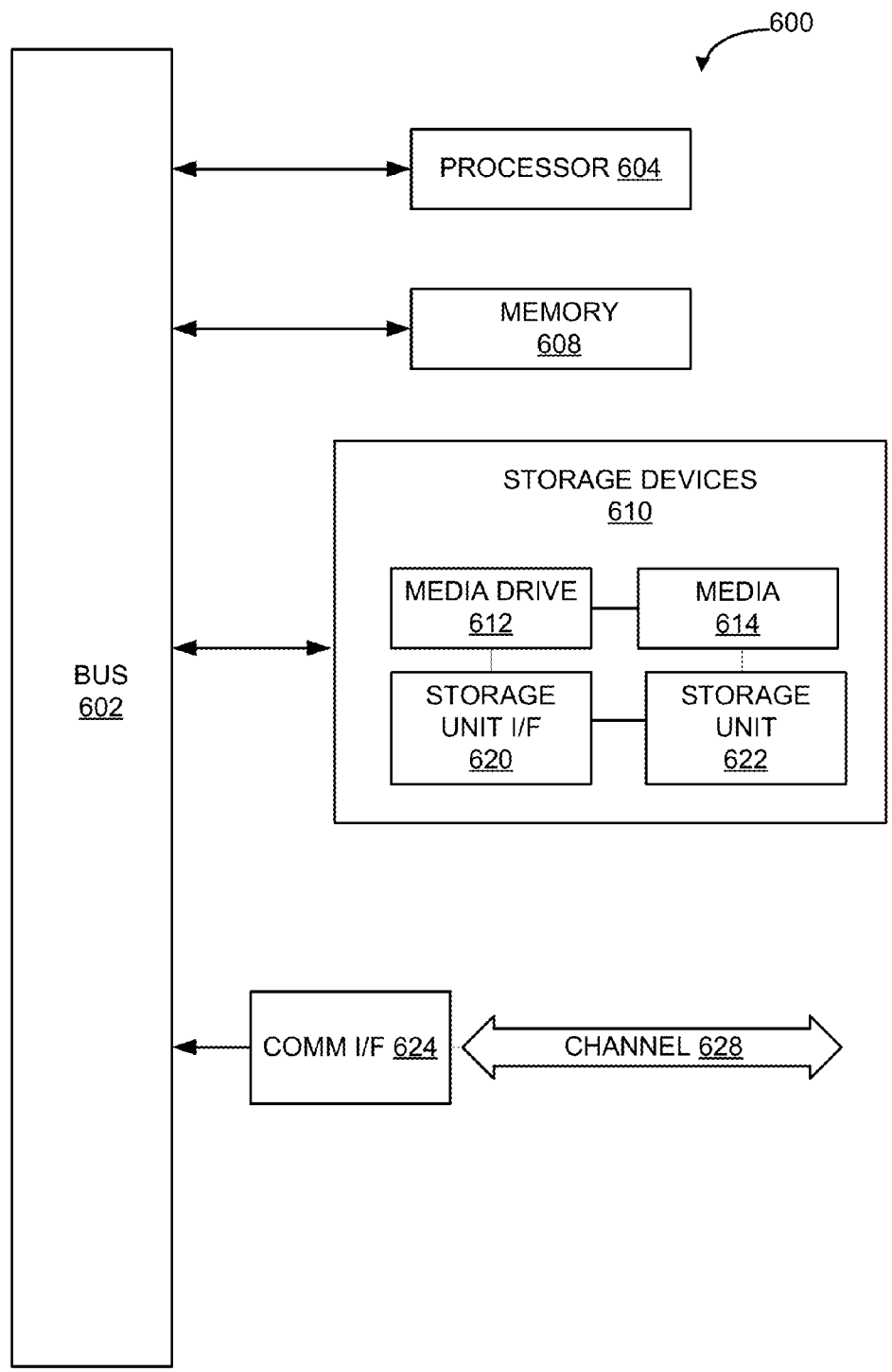
FIG. 6 illustrates an example computing module that may be used in implementing various features of embodiments of the application.

As used herein, the term module might describe a given unit of functionality that can be performed in accordance with one or more embodiments of the present application. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the application are implemented in whole or in part using software, in one embodiment, these software elements can be implemented to operate with a computing or processing module capable of carrying out the functionality described with respect thereto. One such example computing module is shown in FIG. 6. Various embodiments are described in terms of this example-computing module 600. After reading this description, it will become apparent to a person skilled in the relevant art how to implement the application using other computing modules or architectures.

Referring now to FIG. 6, computing module 600 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 600 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 600 might include, for example, one or more processors, controllers, control modules, or other processing devices, such as a processor 604. Processor 604 might be implemented using a general-purpose or special-purpose processing engine such as, for example, a microprocessor, controller, or other control logic. In the illustrated example, processor 604 is connected to a bus 602, although any communication medium can be used to facilitate interaction with other components of computing module 600 or to communicate externally.

Computing module 600 might also include one or more memory modules, simply referred to herein as main memory 608. For example, preferably random access memory (RAM) or other dynamic memory, might be used for storing information and instructions to be executed by processor 604. Main memory 608 might also be used for storing temporary variables or other intermediate information during execution of instructions to be executed by processor 604. Computing module 600 might likewise include a read only memory ("ROM") or other static storage device coupled to bus 602 for storing static information and instructions for processor 604.

The computing module 600 might also include one or more various forms of information storage mechanism 610, which might include, for example, a media drive 612 and a storage unit interface 620. The media drive 612 might include a drive or other mechanism to support fixed or removable storage media 614. For example, a hard disk drive, a floppy disk drive, a magnetic tape drive, an optical disk drive, a CD or DVD drive (R or RW), or other removable or fixed media drive might be provided. Accordingly, storage media 614 might include, for example, a hard disk, a floppy disk, magnetic tape, cartridge, optical disk, a CD or DVD, or other fixed or removable medium that is read by, written to or accessed by media drive 612. As these examples illustrate, the storage media 614 can include a computer usable storage medium having stored therein computer software or data.

In alternative embodiments, information storage mechanism 610 might include other similar instrumentalities for allowing computer programs or other instructions or data to be loaded into computing module 600. Such instrumentalities might include, for example, a fixed or removable storage unit 622 and an interface 620. Examples of such storage units 622 and interfaces 620 can include a program cartridge and cartridge interface, a removable memory (for example, a flash memory or other removable memory module) and memory slot, a PCMCIA slot and card, and other fixed or removable storage units 622 and interfaces 620 that allow software and data to be transferred from the storage unit 622 to computing module 600.

Computing module 600 might also include a communications interface 624. Communications interface 624 might be used to allow software and data to be transferred between computing module 600 and external devices. Examples of communications interface 624 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 624 might typically be carried on signals, which can be electronic, electromagnetic (which includes optical) or other signals capable of being exchanged by a given communications interface 624. These signals might be provided to communications interface 624 via a channel 628. This channel 628 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 608, storage unit 620, media 614, and channel 628. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 600 to perform features or functions of the present application as discussed herein.

While various embodiments of the present application have been described above, it should be understood that they have been presented by way of example only, and not of limitation. Likewise, the various diagrams may depict an example architectural or other configuration for the application, which is done to aid in understanding the features and functionality that can be included in the application. The application is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present application. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the application, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A computer-implemented method, comprising:
receiving a base video file and a derivative video file for archiving, wherein the derivative video file is a derivative of the base video file, and wherein the base video file and derivative video file comprise video content;
identifying a set of differences between the base video file and the derivative video file by:
conducting a bit-to-bit comparison of a plurality of segments of bits in the base video file with a plurality of segments of bits in the derivative video file; and
determining, for each of the plurality of segments of bits in the derivative video file, if the segment of bits in the derivative video file has a total number of different bits exceeding a bit size threshold when compared with a segment of bits in the base video file, wherein the identified set of differences comprise one or more identified segments of bits of the derivative video file that are determined to have a total number of different bits exceeding the bit size threshold;
using at least the identified set of differences:
creating a difference media file, the difference media file comprising the one or more identified segments of bits of the derivative video file, wherein creating the difference media file comprises: extracting the one or more identified segments of bits from the derivative video file or removing one or more segments from the derivative video file that are determined to have a total number of different bits that do not exceed the bit size threshold; and creating a record, the record comprising a set of actual bit locations where each segment of the one or more identified segments is located in the derivative video file, and a set of reference bit locations in the base video file corresponding to the set of actual bit locations, wherein the record is configured to produce the derivative video file based on the base video file and the difference media file; and archiving the base video file, the created difference media file, and the created record file in a media file archive system.

2. The method of claim 1, wherein creating the difference media file comprises extracting the one or more identified segments of bits from the derivative video file.

3. The method of claim 1, wherein the base video file corresponds to an original version of a video, and wherein the derivative video file corresponds to a localized version of the video.

4. The method of claim 3, wherein the localized version of the video is played at a user device communicatively coupled to a content provider over a network, wherein the localized version is played on the user device based on the archived base video file, difference media file, and record.

5. The method of claim 1, further comprising:
receiving a second derivative video file for archiving, wherein the second derivative video file is a second derivative of the base video file;
identifying the received base video file as a base video file for comparison with the received first derivative video file and the received second derivative video file;
identifying a second set of differences between the base video file and the second derivative video file by:
conducting a bit-to-bit comparison of a plurality of segments of bits in the base video file with a plurality of segments of bits in the second derivative video file; and
determining, for each of the plurality of segments of bits in the second derivative video file, if the segment of bits in the second derivative video file has a total number of different bits exceeding a bit size threshold when compared with a segment of bits in the base video file, wherein the identified second set of differences between the base video file and the second derivative video file comprise one or more identified segments of bits of the second derivative video file that are determined to have a total number of different bits exceeding the bit size threshold; and
using at least the identified second set of differences between the base video file and the second derivative video file:
creating a second difference media file, the second difference media file comprising the one or more identified segments of bits of the second derivative video file, wherein creating the second difference media file comprises: extracting the one or more identified segments of bits from the second derivative video file or removing one or more segments of bits from the second derivative video file that are determined to have a total number of different bits that do not exceed the bit size threshold; and
creating a second record, the second record comprising a second set of actual bit locations where each segment of the one or more identified segments is located in the second derivative video file, and a second set of reference bit locations in the base video file corresponding to the second set of actual bit locations, wherein the second record is configured to produce the second derivative video file based on the base video file and the second difference media file.

6. The method of claim 5, wherein the base video file corresponds to an original version of a video, wherein each of the derivative video files correspond to a localized version of the video, the method further comprising: archiving the created second difference media file and the created second record in the media file archive system.

7. A computer-implemented method, comprising: receiving a base video file and a derivative video file for archiving, wherein the derivative video file is a derivative of the base video file, and wherein the base video file and derivative video file comprise video content;
identifying a set of differences between the base video file and the derivative video file by:
conducting a video frame-to-frame comparison of a plurality of video frames of the derivative video file with a plurality of video frames of the base video file; and
determining, for each of the plurality of video frames of the derivative video file, if the video frame of the derivative video file has a matching video frame in the plurality of video frames of the base video file, wherein the identified set of differences comprise one or more identified video frames of the derivative video file that are determined to have no matching video frame in the base video file;
using at least the identified set of differences:
creating a difference media file, the difference media file comprising the one or more identified video frames of the derivative video file, wherein creating the difference media file comprises: extracting the one or more identified video frames from the derivative video file or removing one or more video frames from the derivative video file that are determined to have a matching video frame in the plurality of video frames of the base video file; and
creating a record comprising a set of actual video frame locations where each video frame of the one or more identified video frames is located in the derivative video file, and a set of reference video frame locations in the base video file corresponding to the set of actual video frame locations, wherein the record is configured to produce the derivative video file based on the base video file and the difference media file; and
archiving the base video file, the created difference media file, and the created record file in a media file archive system.

8. The method of claim 7, wherein creating the difference media file comprises extracting the one or more identified video frames from the derivative media file.

9. The method of claim 7, wherein the base video file corresponds to an original version of a video, and wherein the derivative video file corresponds to a localized version of the video.

10. The method of claim 9, wherein the record is a composition playlist text document.

11. The method of claim 10, wherein the localized version of the video is played at a user device communicatively coupled to a content provider over a network, wherein the localized version is played on the user device based on the archived base video file, difference media file, and record.

12. A system, comprising:
a device having memory and a processor coupled to the memory, the memory storing a set of instructions configured to cause the processor to:
receive a base video file and a derivative video file for archiving, wherein the derivative video file is a derivative of the base video file, and wherein the base video file and derivative video file comprise video content;
identify a set of differences between the base video file and the derivative video file by:
conducting a bit-to-bit comparison of a plurality of segments of bits of the base video file with a plurality of segments of bits in the derivative video file; and
determining, for each of the plurality of segments of bits in the derivative video file, if the segment of bits in the derivative video file has a total number of different bits exceeding a bit size threshold when compared with a segment of bits in the base video file, wherein the identified set of differences comprise one or more identified segments of bits of the derivative video file that are determined to have a total number of different bits exceeding the bit size threshold;
using at least the identified set of differences:
create a difference media file, the difference media file comprising the one or more identified segments of bits of the derivative video file, wherein creating the difference media file comprises: extracting the one or more identified segments of bits from the derivative video file or removing one or more segments from the derivative video file that are determined to have a total number of different bits that do not exceed the bit size threshold; and
create a record, the record comprising a set of actual bit locations where each segment of the one or more identified segments is located in the derivative video file, and a set of reference bit locations in the base video file corresponding to the set of actual bit locations, wherein the record is configured to produce the derivative video file based on the base video file and the difference media file; and
archive the base video file, the created difference media file, and the created record file in a media file archive system.

13. The system of claim 12, wherein creating the difference media file comprises extracting the one or more identified segments of bits from the derivative video file.

14. The system of claim 12, wherein the base video file corresponds to an original version of a video, wherein the derivative video file correspond to a localized version of the video.

15. The system of claim 14, wherein the record is a log file or a look-up table.

16. The system of claim 15, wherein the localized version of the video is played at a user device communicatively coupled to a content provider over a network, wherein the localized version is played on the user device based on the archived video file, difference media file, and record.

17. A system, comprising:
a device having memory and a processor coupled to the memory, the memory storing a set of instructions configured to cause the processor to:
receive a base video file and a derivative video file for archiving, wherein the derivative video file is a derivative of the base video file, and wherein the base video file and derivative video file comprise video content;
identify a set of differences between the base video file and the video media file by:
conducting a video frame-to-frame comparison of a plurality of video frames of the derivative video file with a plurality of video frames of the base video file; and
determining, for each of the plurality of video frames of the derivative video file, if the video frame of the derivative video file has a matching video frame in the plurality of video frames of the base video file, wherein the identified set of differences comprise one or more identified video frames of the derivative video file that are determined to have no matching video frame in the base video file;
using at least the identified set of differences:
create a difference media file, the difference media file comprising the one or more identified video frames of the derivative video file, wherein creating the difference media file comprises: extracting the one or more identified video frames from the derivative video file or removing one or more video frames from the derivative video file that are determined to have a matching video frame in the plurality of video frames of the base video file; and
creating a record comprising a set of actual video frame locations where each video frame of one or more identified video frames is located in the derivative video file, and a set of reference video frame locations in the base video file corresponding to the set of actual video frame locations, wherein the record is configured to produce the derivative video file based on the base video file and the difference media file; and
archiving the base video file, the created difference media file, and the created record file in a media file archive system.

* * * * *